(12) United States Patent
Hou

(10) Patent No.: US 11,244,991 B2
(45) Date of Patent: Feb. 8, 2022

(54) PRODUCTION METHOD OF DISPLAY SUBSTRATE, DISPLAY SUBSTRATE, AND DISPLAY APPARATUS

(71) Applicant: BOE Technology Group Co., Ltd., Beijing (CN)

(72) Inventor: Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 226 days.

(21) Appl. No.: 16/073,964

(22) PCT Filed: Jan. 5, 2018

(86) PCT No.: PCT/CN2018/071555
§ 371 (c)(1),
(2) Date: Jul. 30, 2018

(87) PCT Pub. No.: WO2018/209980
PCT Pub. Date: Nov. 22, 2018

(65) Prior Publication Data
US 2020/0185465 A1 Jun. 11, 2020

(30) Foreign Application Priority Data
May 18, 2017 (CN) .......................... 201710352225.7

(51) Int. Cl.
*H01L 27/32* (2006.01)
*H01L 51/52* (2006.01)
*H01L 51/56* (2006.01)

(52) U.S. Cl.
CPC ...... *H01L 27/3246* (2013.01); *H01L 27/3283* (2013.01); *H01L 51/5268* (2013.01); *H01L 51/56* (2013.01)

(58) Field of Classification Search
CPC . H01L 51/5268; H01L 51/56; H01L 27/3283; H01L 27/3246; H01L 2251/5369
See application file for complete search history.

(56) References Cited

U.S. PATENT DOCUMENTS

| 8,916,892 B2 | 12/2014 | Jo et al. |
| 9,166,205 B2 | 10/2015 | Jo et al. |

(Continued)

FOREIGN PATENT DOCUMENTS

| CN | 102487128 A | 6/2012 |
| CN | 103928497 A | 7/2014 |

(Continued)

OTHER PUBLICATIONS

International Search Report and Written Opinion, including English translation of Box V, of the Written Opinion, for International Application No. PCT/CN2018/071555, dated Apr. 8, 2018, 20 pages.

(Continued)

*Primary Examiner* — Vongsavanh Sengdara
(74) *Attorney, Agent, or Firm* — Westman, Champlin & Koehler, P.A.

(57) ABSTRACT

This disclosure relates to a production method of a display substrate, a display substrate, and a display apparatus. This production method comprises steps of: forming a thin film for a pixel defining layer used to define a light-emitting area of each sub-pixel on a base substrate; forming nanoparticles in a preset area of the thin film for the pixel defining layer, wherein the preset area is an area corresponding to a place between adjacent sub-pixels; and performing patterning treatment on the thin film for the pixel defining layer formed with the nanoparticles, with a material in the preset area being retained, to form a pattern of the pixel defining layer.

9 Claims, 4 Drawing Sheets

(56) References Cited

U.S. PATENT DOCUMENTS

| | | | |
|---|---|---|---|
| 9,911,794 B2 | 3/2018 | Jiao | |
| 2004/0241591 A1* | 12/2004 | Tomoi | G03F 7/039 430/322 |
| 2008/0093978 A1 | 4/2008 | Mori | |
| 2009/0236977 A1* | 9/2009 | Suh | B82Y 20/00 313/504 |
| 2010/0263720 A1* | 10/2010 | Detje | H01L 31/02168 136/256 |
| 2012/0138937 A1 | 6/2012 | Jo et al. | |
| 2013/0210236 A1* | 8/2013 | Ogihara | G03F 7/0752 438/706 |
| 2013/0228801 A1 | 9/2013 | Lee | |
| 2014/0008618 A1 | 1/2014 | Lim et al. | |
| 2015/0064826 A1 | 3/2015 | Jo et al. | |
| 2016/0254331 A1 | 9/2016 | Wang | |
| 2016/0260785 A1* | 9/2016 | Jiao | H01L 51/5259 |

FOREIGN PATENT DOCUMENTS

| | | |
|---|---|---|
| CN | 103972267 A | 8/2014 |
| CN | 105244454 A | 1/2016 |
| CN | 105529409 A | 4/2016 |
| CN | 107170781 A | 9/2017 |
| KR | 10-2012-0067644 A | 6/2012 |

OTHER PUBLICATIONS

First Office Action, including Search Report, for Chinese Patent Application No. 201710352225.7, dated Apr. 8, 2019, 11 pages.

* cited by examiner

PRODUCTION METHOD OF DISPLAY SUBSTRATE, DISPLAY SUBSTRATE, AND DISPLAY APPARATUS

CROSS-REFERENCE TO RELATED APPLICATION

This application is a Section 371 National Stage Application of International Application No. PCT/CN2018/071555 filed on Jan. 5, 2018 and entitled "PRODUCTION METHOD OF DISPLAY SUBSTRATE, DISPLAY SUBSTRATE, AND DISPLAY APPARATUS", which claims the benefit of priority of Chinese Application No. 201710352225.7 filed on May 18, 2017, the entire contents of which are hereby incorporated by reference.

TECHNICAL FIELD

This disclosure relates to the technical field of display, and particularly to a production method of a display substrate, a display substrate, and a display apparatus.

BACKGROUND ART

At present, in the production of OLED (organic light-emitting diode) display panels, the thin film deposition methods mainly include two methods, which are vacuum deposition and solution process. A pixel defining layer is required to be provided in both of these two methods to reduce the problems such as cross-color between adjacent pixels. In the prior art, someone introduces inorganic nanoparticles into a pixel defining layer to increase scattering of light or play a role in water absorption, or the like. In a conventional process, a material of nanoparticles is first doped into a pixel defining layer material and is then exposed and developed.

SUMMARY

The object of this disclosure is to provide a production method of a display substrate, a display substrate, and a display apparatus.

A production method of a display substrate provided in an embodiment of this disclosure comprises steps of:

forming a thin film for a pixel defining layer used to define a light-emitting area of each sub-pixel on a base substrate;

forming nanoparticles in a preset area of the thin film for the pixel defining layer, wherein the preset area is an area corresponding to a place between adjacent sub-pixels; and performing patterning treatment on the thin film for the pixel defining layer formed with the nanoparticles, with a material in the preset area being retained, to form a pattern of the pixel defining layer.

Optionally, the step of forming nanoparticles in a preset area of the thin film for the pixel defining layer comprises:

applying a mixed solution containing the nanoparticles on the preset area of the thin film for the pixel defining layer on a side away from the base substrate; and performing prebaking treatment on the base substrate to allow the nanoparticles in the mixed solution to enter the preset area of the thin film for the pixel defining layer.

Optionally, the prebaking treatment comprises baking at a temperature of 80° C.-150° C. for 80 s-200 s.

Optionally, the thin film for the pixel defining layer is formed from one or more materials selected from polyimide, polymethyl methacrylate, fluorinated polyimide, fluorinated polymethyl methacrylate, and polysiloxane.

Optionally, said applying a mixed solution containing the nanoparticles on the preset area of the thin film for the pixel defining layer on a side away from the base substrate comprises:

printing the mixed solution containing the nanoparticles on the preset area of the thin film for the pixel defining layer on a side away from the base substrate by using a process of ink-jet printing or nozzle printing.

Optionally, the mixed solution further comprises a polar solvent for dispersing the nanoparticles.

Optionally, the polar solvent comprises one of water, alcohols, and esters or a combination thereof.

Optionally, a content of the nanoparticles in the mixed solution is 0.5%-30% by mass, based on a total mass of the mixed solution.

Optionally, a thickness of the mixed solution applied on the thin film for the pixel defining layer is not greater than that of the thin film for the pixel defining layer.

Optionally, the patterning treatment comprises exposure and development.

Optionally, the nanoparticles comprise a material selected from one of silicon dioxide, silicon nitride, calcium oxide, and barium oxide or a combination thereof.

An embodiment of this disclosure further provides a display substrate, comprising:

a base substrate, and a patterned pixel defining layer provided on the base substrate, wherein the patterned pixel defining layer comprises nanoparticles only in a preset area, and the preset area is an area corresponding to a place between adjacent sub-pixels.

Optionally, the display substrate is produced by using a method comprises steps of: forming a thin film for a pixel defining layer used to define a light-emitting area of each sub-pixel on a base substrate;

forming nanoparticles in a preset area of the thin film for the pixel defining layer, wherein the preset area is an area corresponding to a place between adjacent sub-pixels; and performing patterning treatment on the thin film for the pixel defining layer formed with the nanoparticles, with a material in the preset area being retained, to form a pattern of the pixel defining layer.

Optionally, the nanoparticles are uniformly dispersed in the pixel defining layer; or the nanoparticles have a linear structure formed by agglomeration.

Optionally, the nanoparticles comprise a material selected from one of silicon dioxide, silicon nitride, calcium oxide, and barium oxide or a combination thereof.

An embodiment of this disclosure further provides a display apparatus, comprising the above display substrate provided in an embodiment of this disclosure.

DESCRIPTION OF EMBODIMENTS

The technical solutions in embodiments of this disclosure will be clearly and fully described below in conjunction with accompanying drawings in embodiments of this disclosure. Obviously, the embodiments described are merely a part of the embodiments of this disclosure, rather than all of the embodiments. Based on the embodiments of this disclosure, all other embodiments obtained by those of ordinary skill in the art without performing inventive work belong to the scope protected by this disclosure.

Here, the thicknesses and area shapes of film layers in the accompanying drawings do not indicate the real ratios thereof, and the object thereof is merely to exemplarily illustrate the contents of this disclosure.

The display substrate provided in an embodiment of this disclosure is mainly directed to a self light-emitting display substrate capable of being electroluminescent, such an OLED substrate, a QLED substrate, a Micro LED substrate, and the like. The improvement for the production process of a pixel defining layer located in a non-display area comprises: not only nanoparticles are added in the pixel defining layer, but also the added nanoparticles will not impact the patterning treatment process or the precision thereof since the nanoparticles are only formed in areas between adjacent sub-pixels on thin film for the pixel defining layer. The specific production method of a display substrate is illustrated in detail below.

Figure 1:
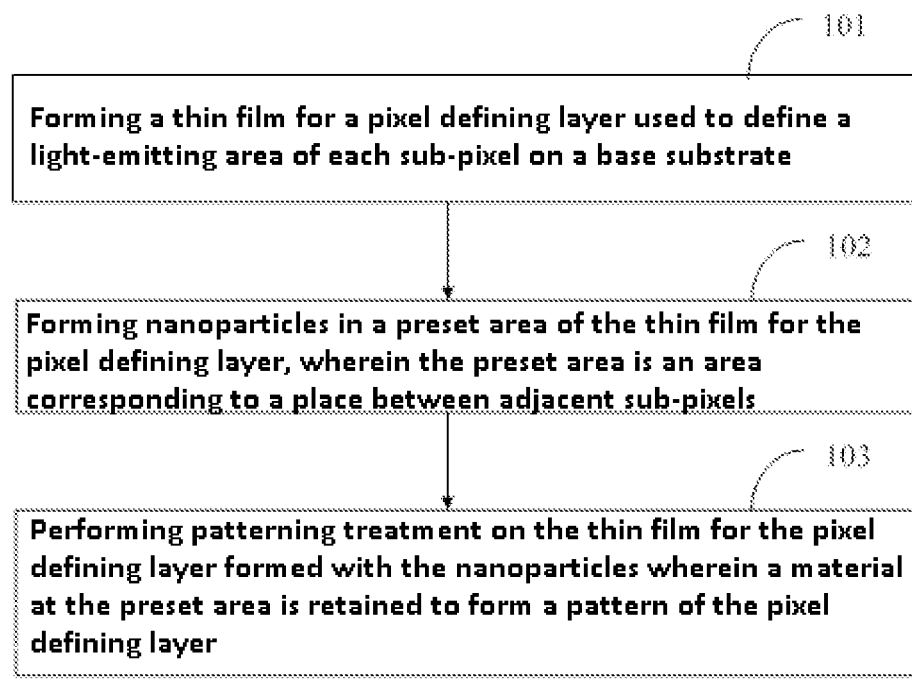
FIG. 1 is a flow chart of the steps of a production method of a display substrate provided in an embodiment of this disclosure.

As shown in FIG. 1, it is a flow chart of the steps of a production method of a display substrate provided in an embodiment of this disclosure. Specifically, it may be achieved by the following steps:

Step 101, forming a thin film for a pixel defining layer used to define a light-emitting area of each sub-pixel on a base substrate;

Step 102, forming nanoparticles in a preset area of the thin film for the pixel defining layer, wherein the preset area is an area corresponding to a place between adjacent sub-pixels; and Step 103, performing patterning treatment on the thin film for the pixel defining layer formed with the nanoparticles, with a material in the preset area being retained, to form a pattern of the pixel defining layer.

In the production method of the display substrate provided in an embodiment of this disclosure, a thin film for a pixel defining layer is first produced, and nanoparticles are then formed in a preset area of the thin film for the pixel defining layer. The added nanoparticles will not impact the patterning treatment process or the precision thereof since the nanoparticles are only formed in areas between adjacent sub-pixels on a thin film for a pixel defining layer.

Figure 2A:
FIGS. 2a-2c are structural schematic diagrams after the steps in the production method for forming the display substrate provided in an embodiment of this disclosure are performed, respectively.

In specific implementation, the specific means for forming the thin film for the pixel defining layer and materials used in production may not be limited. For example, as the specific means for forming, a spin coating process, a slit-type coating process, an electrostatic scattering coating process, or the like may be used. As the materials used in production, polyimide, polymethyl methacrylate, fluorinated polyimide, fluorinated polymethyl methacrylate, polysiloxane, or the like may be used. It is feasible as long as the structure as shown in FIG. 2a is formed, i.e., a thin film 11 for producing a pattern of a pixel defining layer is formed on a base substrate 10, after the Step 101 is performed.

Figure 2B:
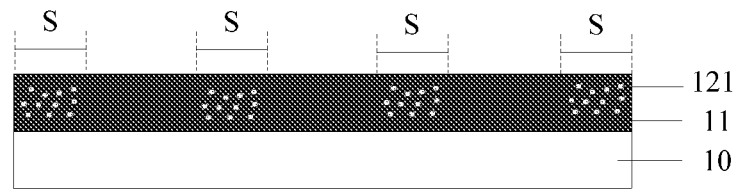

In specific implementation, when the Step 102 described above is implemented, nanoparticles 121 are only formed in preset areas S on the thin film for the pixel defining layer 11 on the base substrate 10 in an embodiment of this disclosure, in order to prevent the precision from being impacted when patterning treatment processes such as exposure, development, and the like are subsequently performed on the thin film for the pixel defining layer, as shown in FIG. 2b. This preset area S refers to an area, which is not required to be exposed and developed, located between adjacent sub-pixels, and of course may also be extended to other areas as needed.

Figure 2C:
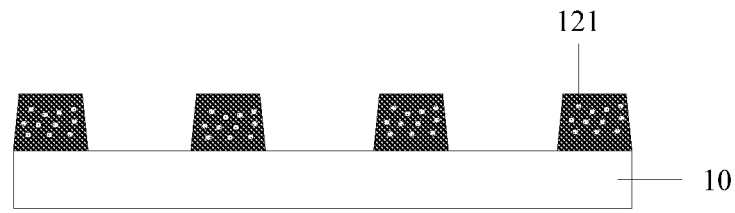

In specific implementation, the nanoparticles 121 enter the interior of the thin film for the pixel defining layer 11 after the Step 102 described above is performed, and the Step 103 is then performed to perform patterning treatment on the thin film for the pixel defining layer 11 on which the nanoparticles 121 are formed. The steps of the patterning treatment mainly comprise exposure and development. An object of the patterning treatment is to remove materials in areas other than the preset areas and retain materials (including a material of a thin film for a pixel defining layer and nanoparticles located therein) in the preset areas to form a pattern of a pixel defining layer as shown in FIG. 2c. Additionally, postbaking is required to be performed on the pattern of the pixel defining layer formed after exposure and development are completed, wherein the temperature of the postbaking is typically 200° C.-250° C. and the baking lasts for 10 min-120 min.

In specific implementation, the added nanoparticles will not impact the patterning treatment process or the precision thereof since the nanoparticles are only formed in areas between adjacent sub-pixels on a pixel defining layer thin film in the method provided in an embodiment of this disclosure.

Figure 3:
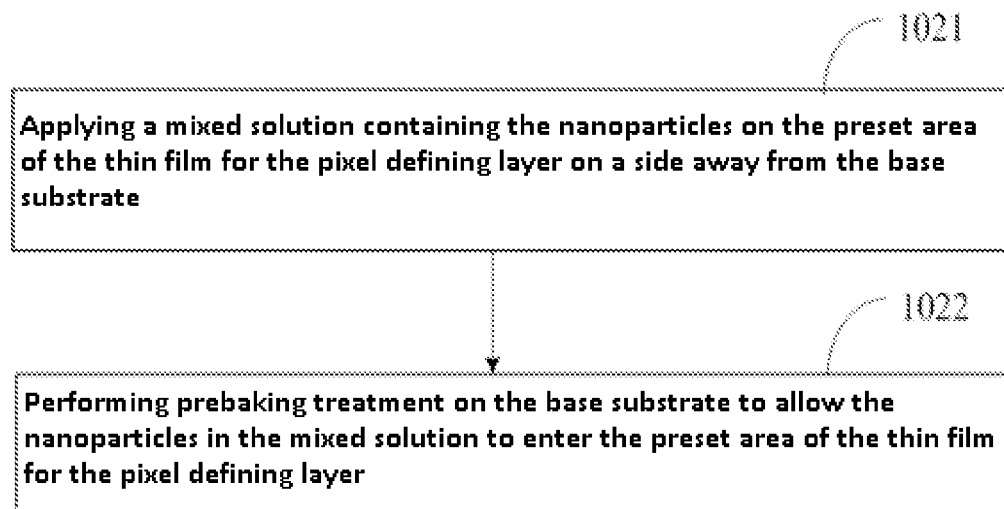
FIG. 3 is a flow chart of the steps of a method for forming nanoparticles in a preset area of a thin film for the pixel defining layer provided in an embodiment of this disclosure.

How to form nanoparticles in a preset area of a thin film for a pixel defining layer is specifically introduced below. As shown in FIG. 3, it is a flow chart of the steps of a method for forming nanoparticles in a preset area of a thin film for a pixel defining layer provided in an embodiment of this disclosure. Specifically, it may be achieved by the following steps:

Step 1021, applying a mixed solution containing the nanoparticles on the preset area of the thin film for the pixel defining layer on a side away from the base substrate;

Step 1022, performing prebaking treatment on the base substrate to allow the nanoparticles in the mixed solution to enter the preset area of the thin film for the pixel defining layer.

Figure 4:
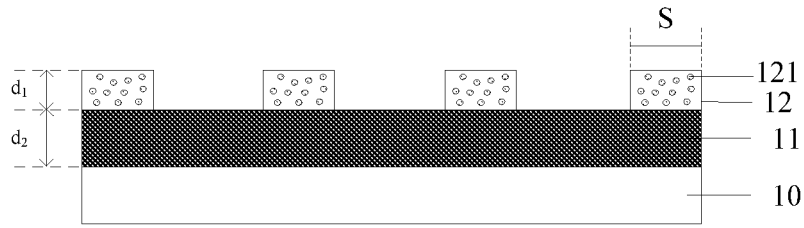
FIG. 4 is a structural schematic diagram of applying a mixed solution containing nanoparticles on a preset area of the thin film for the pixel defining layer on a side away from the base substrate.

In specific implementation, when the Step 1021 described above is implemented, it is desired to apply a mixed solution containing nanoparticles on a preset area S of the thin film for the pixel defining layer on a side away from the base substrate. A solution method, in which nanoparticles are dissolved in a solvent, is used as a method of forming nanoparticles. A mixed solution 12 containing nanoparticles 121 is then printed on a preset area of the thin film for the pixel defining layer on a side away from the base substrate by using a process of ink-jet printing or nozzle printing to form a structure as shown in FIG. 4. Here, the ink droplets ejected from a nozzle upon printing in a nozzle printing process are continuously dropped. The printing of the mixed solution containing nanoparticles onto the preset area S in the thin film for the pixel defining layer may be achieved by controlling the parameters such as duration of single printing, position of printing, and the like in the nozzle printing process.

The thickness of the mixed solution 12 specifically produced may not be excessively large. Optionally, as shown in FIG. 4, the thickness $d_1$ of the mixed solution 12 applied on the thin film for the pixel defining layer 11 on the base substrate 10 is not greater than the thickness $d_2$ of the thin film for the pixel defining layer 11. The mixed solution 12 described above comprises nanoparticles 121.

Specifically, the mixed solution described above is desired to comprise a solvent in addition to the nanoparticles. Optionally, the mixed solution further comprises a polar solvent for dispersing the nanoparticles. The specific material of the polar solvent may not be limited, as long as it can disperse nanoparticles and will not corrode or impact the thin film for the pixel defining layer. Optionally, the polar solvent comprises one or a combination of the following solvents: water, alcohols, and esters.

When the mixed solution is specifically produced, the amount of the nanoparticles may be adjusted correspondingly according to process requirements. If the content of the nanoparticles is excessively large, agglomeration will easily occur, and the uniform coating on the thin film for the pixel defining layer is difficult. Optionally, a content of the nanoparticles in the mixed solution is 0.5%-30% by mass, based on a total mass of the mixed solution.

When the nanoparticle are dissolved in the solvent, the nanoparticles will not typically diffuse into the thin film for the pixel defining layer since there is a large difference in polarities between solvents. However, in order to enable the nanoparticles to enter the interior of the thin film for the pixel defining layer, the solvent is desired to volatilize. With the volatilization of the solvent, the nanoparticles will be divided and dispersed into the interior of the thin film for the pixel defining layer.

In specific implementation, when the Step 1022 described above is implemented, the polar solvent bearing nanoparticles is allowed to volatilize by performing prebaking treatment on the base substrate. In the process of volatilization, the nanoparticles will enter the interior of the thin film for the pixel defining layer to form a structure as shown in FIG. 2c. That is, the nanoparticles 121 will enter the preset area of the thin film for the pixel defining layer on the base substrate 10 as the solvent volatilizes, and may be dispersed nanoparticles as shown in FIG. 2c or may be linear nanoparticles formed by agglomeration (it will be introduced below for this case).

Here, since the process of prebaking is required to be performed before exposure and development are subsequently performed on the thin film for the pixel defining layer, the step of prebaking described above may also be used as a step of prebaking before exposure and development. The nanoparticles in the mixed solution located on the preset area of the thin film for the pixel defining layer may be allowed to enter the interior of the thin film for the pixel defining layer without adding additional production processes. When the prebaking is performed, the process temperature is typically 80° C.-150° C. and the baking lasts for 80 s-200 s.

Figure 5:
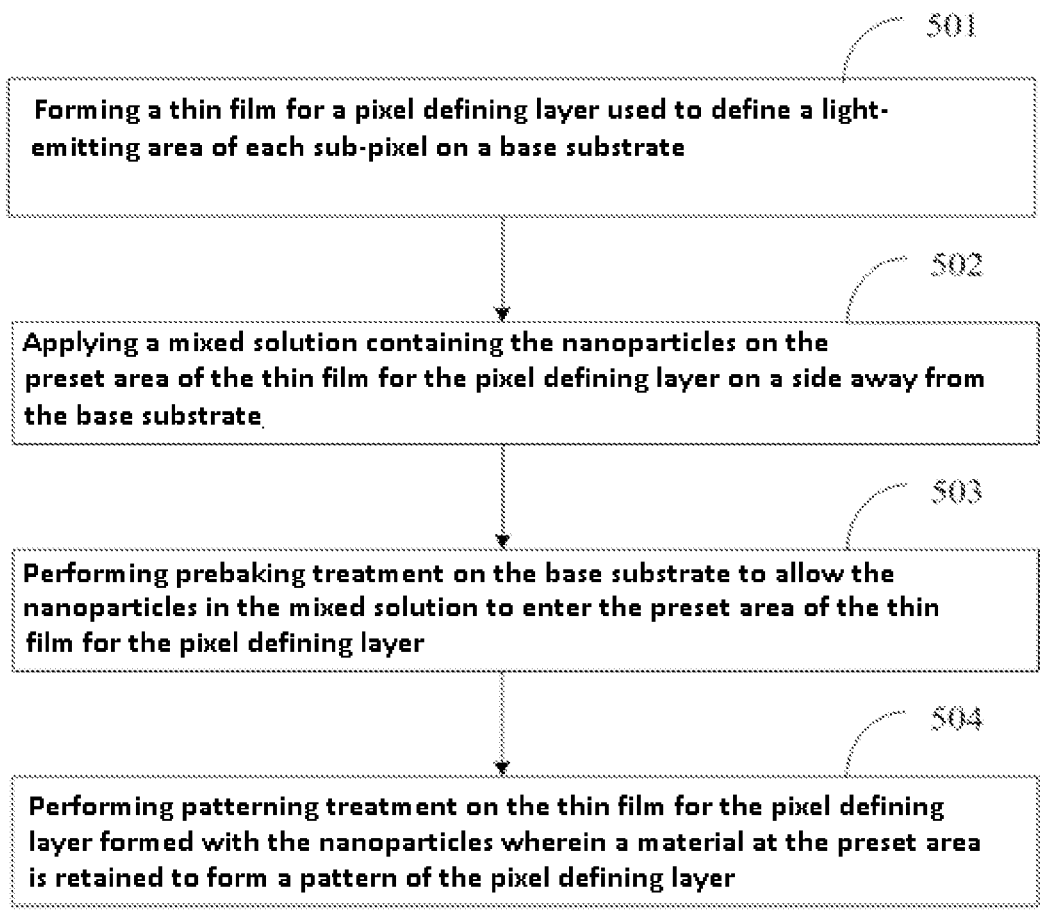
FIG. 5 is a flow chart of overall steps of the above production method of the display substrate provided in an embodiment of this disclosure.

In order to clearly illustrate the production method of the display substrate provided in an embodiment of this disclosure, as shown in FIG. 5, a flow chart of overall steps of the above production method of the display substrate provided in an embodiment of this disclosure comprises the steps of:

Step 501, forming a thin film for a pixel defining layer used to define a light-emitting area of each sub-pixel on a base substrate;

Step 502, applying a mixed solution containing the nanoparticles on the preset area of the thin film for the pixel defining layer on a side away from the base substrate;

Step 503, performing prebaking treatment on the base substrate to allow the nanoparticles in the mixed solution to enter the preset area of the thin film for the pixel defining layer; and Step 504, performing patterning treatment on the thin film for the pixel defining layer formed with the nanoparticles, with a material in the preset area being retained, to form a pattern of the pixel defining layer.

Based on the same inventive concept, as shown in FIG. 2c, an embodiment of this disclosure further provides a display substrate, comprising a base substrate 10, and a patterned pixel defining layer provided on the base substrate, wherein the patterned pixel defining layer comprises nanoparticles 121 only in a preset area, and the preset area is an area corresponding to a place between adjacent sub-pixels. For the implementation of this display substrate, an embodiment of any display substrate may be referred to. Verbose words are omitted herein.

Optionally, this display substrate may be produced by using the above method as provided in an embodiment of this disclosure to form a base substrate 10, and a patterned pixel defining layer which is provided in a preset area on the base substrate and comprises nanoparticles 121. That is, a structure as shown in FIG. 2c is formed.

Figure 6:
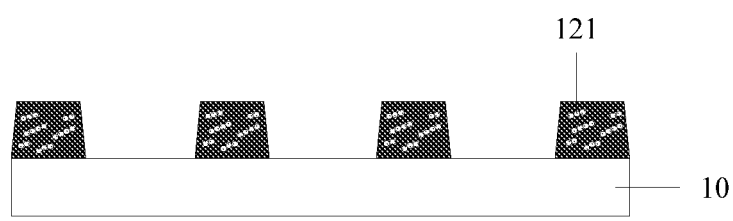
FIG. 6 is a structural schematic diagram of a display substrate comprising linear nanoparticles formed by agglomeration provided in an embodiment of this disclosure.

Specifically, the nanoparticles may be uniformly dispersed in the pixel defining layer; or the nanoparticles may have a linear structure formed by agglomeration. In FIG. 2c, the pixel defining layer comprises dispersed nanoparticles; and agglomeration of the nanoparticles may occur in the process of production to form a linear shape. As shown in FIG. 6, it is a structural schematic diagram of a display substrate comprising linear nanoparticles 121 formed by agglomeration provided in an embodiment of this disclosure. In FIG. 6, the nanoparticles 121 in the pattern of the pixel defining layer located on the base substrate 10 are in a linear shape formed by agglomeration.

Here, FIG. 2c and FIG. 6 briefly illustrate the relative relationship between the nanoparticles and the pixel defining layer only, but are not intended to limit this disclosure. In practical production, the pattern formed may be slightly changed, for example the shape of the pixel defining layer formed, the shape of the linear nanoparticles formed by agglomeration, or the like.

Specifically, the material of the nanoparticle may be provided as needed. Optionally, the nanoparticle has a material comprising one or a combination of the following materials: silicon dioxide, silicon nitride, calcium oxide, or barium oxide. Here, the effect of silicon dioxide or silicon nitride is mainly improving light scattering and increasing light extraction efficiency; and the effect of calcium oxide or barium oxide is mainly absorbing water and increasing the service life of devices. In order not to impact the precision of ink-jet printing, the production of the pixel defining layer, and the like, particles having a diameter less than 100 nanometers are typically selected as the nanoparticles.

Based on the same inventive concept, an embodiment of this disclosure further provides a display apparatus, comprising the above display substrate provided in an embodiment of this disclosure. For the implementation of this display apparatus, an embodiment of any display substrate may be referred to. Verbose words are omitted herein.

In summary, in the production method of the display substrate provided in an embodiment of this disclosure, a pixel defining layer thin film is first produced, nanoparticles are formed in a preset area of the thin film for the pixel defining layer, and patterning treatment is then performed on the thin film for the pixel defining layer. The nanoparticles added in the thin film for the pixel defining layer will not impact the patterning treatment process or the precision thereof since only the material located in the preset area are correspondingly retained when the patterning treatment is performed.

Obviously, various modifications and variations may be made to this disclosure by the person skilled in the art without deviating from the spirit and the scope of this disclosure. Thus, if these modifications and variations of this disclosure are within the scope of the claims of this invention and equivalent techniques thereof, this disclosure also intends to encompass these modifications and variations.

What is claimed is:

1. A production method of a display substrate, comprising steps of:
    forming a thin film for a pixel defining layer used to define a light-emitting area of each sub-pixel on a base substrate;
    forming nanoparticles only in a preset area of the thin film for the pixel defining layer, wherein the preset area is an area situated between adjacent sub-pixels in the thin film for the pixel defining layer, and the nanoparticles are selected from silicon dioxide nanoparticles, silicon nitride nanoparticles, calcium oxide nanoparticles, and barium oxide nanoparticles or a combination thereof; and
    performing patterning treatment on the thin film for the pixel defining layer formed with the nanoparticles, with a material in the preset area being retained, to form a pattern of the pixel defining layer,
    wherein the step of forming nanoparticles only in a preset area of the thin film for the pixel defining layer comprises:
        applying a mixed solution containing the nanoparticles on the preset area of the thin film for the pixel defining layer on a side away from the base substrate; and
        performing prebaking treatment on the base substrate to allow the nanoparticles in the mixed solution to enter the preset area of the thin film for the pixel defining layer.

2. The method as claimed in claim 1, wherein the prebaking treatment comprises baking at a temperature of 80° C.-150° C. for 80 s-200 s.

3. The method as claimed in claim 1, wherein the thin film for the pixel defining layer is formed from one or more materials selected from polyimide, polymethyl methacrylate, fluorinated polyimide, fluorinated polymethyl methacrylate, and polysiloxane.

4. The method as claimed in claim 1, wherein said applying a mixed solution containing the nanoparticles on the preset area of the thin film for the pixel defining layer on a side away from the base substrate comprises:
    printing the mixed solution containing the nanoparticles on the preset area of the thin film for the pixel defining layer on a side away from the base substrate by using a process of ink-jet printing or nozzle printing.

5. The method as claimed in claim 1, wherein the mixed solution further comprises a polar solvent for dispersing the nanoparticles.

6. The method as claimed in claim 5, wherein the polar solvent comprises one of water, alcohols, and esters or a combination thereof.

7. The method as claimed in claim 1, wherein a content of the nanoparticles in the mixed solution is 0.5%-30% by mass, based on a total mass of the mixed solution.

8. The method as claimed in claim 1, wherein a thickness of the mixed solution applied on the thin film for the pixel defining layer is not greater than that of the thin film for the pixel defining layer.

9. The method as claimed in claim 1, wherein the patterning treatment comprises exposure and development.

* * * * *